United States Patent
Ku et al.

(10) Patent No.: US 8,793,091 B2
(45) Date of Patent: Jul. 29, 2014

(54) SYSTEM AND METHOD FOR INTEGRATED CIRCUIT CALIBRATION

(75) Inventors: Ting Ku, San Jose, CA (US); Shifeng Yu, Fremont, CA (US); Brian Smith, Mountain View, CA (US)

(73) Assignee: Nvidia Corporation, Santa Clara, CA (US)

( * ) Notice: Subject to any disclaimer, the term of this patent is extended or adjusted under 35 U.S.C. 154(b) by 504 days.

(21) Appl. No.: 12/101,029

(22) Filed: Apr. 10, 2008

(65) Prior Publication Data

US 2009/0259425 A1 Oct. 15, 2009

(51) Int. Cl.
G01K 15/00 (2006.01)
(52) U.S. Cl.
CPC .................................... G01K 15/00 (2013.01)
USPC ......................................................... 702/99
(58) Field of Classification Search
CPC ........... G01K 15/00; G01K 7/01; G01J 5/522; G01J 2005/0048; G01J 5/08; G01D 3/022; G01F 1/04; G01R 19/16552
USPC ............... 702/99; 327/108; 600/547; 326/30; 713/171; 705/27; 365/189.05
See application file for complete search history.

(56) References Cited

U.S. PATENT DOCUMENTS

| | | | |
|---|---|---|---|
| 4,303,978 A | 12/1981 | Shaw et al. | |
| 5,561,384 A | 10/1996 | Reents et al. | |
| 5,600,271 A | 2/1997 | Erickson et al. | |
| 5,898,232 A | 4/1999 | Reents et al. | |
| 6,067,627 A | 5/2000 | Reents | |
| 6,385,236 B1 | 5/2002 | Chen | |
| 6,448,812 B1 | 9/2002 | Bacigalupo | |
| 7,058,827 B2 | 6/2006 | Rose et al. | |
| 7,184,360 B2 | 2/2007 | Gregorius et al. | |
| 7,557,941 B2 | 7/2009 | Walmsley | |
| 7,583,104 B2 | 9/2009 | Simmons et al. | |
| 7,698,586 B2 | 4/2010 | Kim et al. | |
| 7,827,427 B2 | 11/2010 | Lee et al. | |
| 8,006,008 B2 | 8/2011 | Oliver | |
| 8,250,414 B2 | 8/2012 | Rohatschek | |
| 2002/0000858 A1 | 1/2002 | Lu | |
| 2004/0158167 A1* | 8/2004 | Smith et al. | 600/547 |
| 2005/0218927 A1* | 10/2005 | Shaikh et al. | 326/30 |
| 2006/0143454 A1 | 6/2006 | Walmsley | |
| 2007/0050167 A1 | 3/2007 | Johnson | |
| 2007/0152704 A1* | 7/2007 | Park | 326/30 |
| 2007/0222528 A1 | 9/2007 | Pernia et al. | |
| 2008/0082847 A1 | 4/2008 | Lee et al. | |
| 2008/0211534 A1* | 9/2008 | Jeong et al. | 326/30 |
| 2008/0243636 A1* | 10/2008 | Frantz | 705/27 |
| 2008/0282087 A1* | 11/2008 | Stollon et al. | 713/171 |
| 2009/0085614 A1* | 4/2009 | Parameswaran et al. | 327/108 |
| 2009/0091986 A1* | 4/2009 | Bringivijayaraghavan et al. | 365/189.05 |
| 2009/0150733 A1* | 6/2009 | Takizawa | 714/734 |
| 2011/0255411 A1 | 10/2011 | Isaac et al. | |
| 2012/0299756 A1 | 11/2012 | Chen et al. | |

* cited by examiner

*Primary Examiner* — Tung S Lau
*Assistant Examiner* — Xiuquin Sun

(57) ABSTRACT

A system and method for calibrating an integrated circuit. The method includes configuring a first impedance for a first output of the integrated circuit according to a first configuration code and measuring a first voltage at the first output which corresponds to the first configuration code. The method further includes configuring a second impedance for a second output of the integrated circuit according to a second configuration code and measuring a second voltage at the second output which corresponds to the second configuration code. A determination of which of the first voltage and the second voltage is nearest to a predetermined voltage value. Based on the voltage determination, the integrated circuit is configured according a code of said first and second codes that corresponds to the voltage nearest to the predetermined voltage.

26 Claims, 6 Drawing Sheets

100

SYSTEM AND METHOD FOR INTEGRATED CIRCUIT CALIBRATION

FIELD OF THE INVENTION

Embodiments of the present invention are generally related to calibrating integrated circuits used for communication.

BACKGROUND OF THE INVENTION

As integrated circuit design has advanced, integrated circuits have become smaller, faster, and more sensitive. As a result, the performance of an integrated circuit is impacted by a variety of factors both during and after manufacturing. During manufacturing, process variations can result in integrated circuits having different properties such as varied impedance. After manufacturing when an integrated circuit is in use there may be variations that depend on voltage and temperature. For example, voltage variations may impact the speed of components of an integrated circuit. Further, an integrated circuit may be impacted by the temperature of the surrounding environment. The variations of process, voltage, and temperature are referred to as PVT variations.

FIG. 1 shows a conventional system for calibrating a driver circuit of an integrated circuit during operation of the circuit. Conventional system 100 or integrated circuit 100 includes two additional circuits 101a and 101b that duplicate the drive functionality and are used for calibration. These two additional circuits provide additional signal paths for calibration of the integrated circuit. Circuits 101a and 101b utilize additional balls or pins on an integrated circuit dedicated to calibration.

Circuit 101a includes pull up circuit 102a, pull down circuit 104a, pull down resistor 106a, comparator 108a, reference voltage 112, and state machine 110a. When enabled, state machine 110a varies a code which is issued to variable pull up resistor 102a which adjusts the impedance of pull up circuit 102a. Pull up circuit 102a is coupled to precision resistor 106a. Pull down resistor 106a is located on a circuit board and coupled to integrated circuit 100a via an integrated circuit ball such as output 105a. Precision resistor 106a is further coupled to comparator 108a. Comparator 108a receives a voltage signal from reference voltage 112 and output 105a. Reference voltage 112 is half of the power supply voltage. When the impedance of pull up circuit 102a is adjusted such that it is equal to the impedance of pull down resistor 106a, the input to comparator 108a will be half of the power supply voltage. As codes are issued to pull up circuit 102a and the impedance of pull up circuit 102a varies, the voltage received by comparator 108a will vary. Thus, when the code issued to pull up circuit 102a results in the inputs to comparator 108a being close or equal, that code can be issued to all drivers of the device to calibrate the pull up circuits in system 100.

Circuit 101b calibrates the pull down side and works similarly to circuit 101a. Circuit 101b includes pull up circuit 102b, pull down circuit 104b, pull up resistor 106b, comparator 108b, reference voltage 112, and state machine 110b. Pull down circuit 104b is coupled to state machine 110b and pull up resistor 106b. State machine 110b controls the impedance of the pull down circuit 104b by issuing a sequence of control codes to pull down circuit 104b. State machine 110b receives a signal from comparator 108b which compares reference voltage 112 and the voltage at output 105b. State machine 110b issues a control code to pull down circuit 104b which changes the impedance and based the output of comparator 108b, state machine 110b determines the code which corresponds to the impedance of pull down circuit 104b matching the impedance of pull up resistor 106b. This code is sent to all drivers of the device.

Thus, state machines 110a and 110b can vary the impedance codes by scanning up and down the control codes. State machine 110a observes the voltage level changes on balls and the correct impedance codes can be determined when desired voltage level is reached. Thus, system 100 may track process, voltage, and temperature variation while the circuit is in operation.

While system 100 allows a circuit to be calibrated during operation, the calibration system requires extra dedicated calibration circuitry and supporting logic, accurate resistors, integrated circuit package balls, and power. The additional circuitry required makes the circuit more expensive to manufacture. Also, the extra integrated circuit package balls restricts the number of available input/outputs and therefore makes circuit design more complex. The use of additional power is particularly problematic for devices having limited power resources such as mobile devices, etc.

SUMMARY OF THE INVENTION

Accordingly, what is needed is a solution for calibrating an integrated according to the variations without the need for additional circuitry, integrated circuit package balls, or additional power consumption. Embodiments of the present invention provide a solution for calibrating the drivers of an integrated circuit. Embodiments of the present invention allow for calibration of the integrated circuit without the need for extra dedicated pins or balls, additional power consumption, or extra circuitry.

In one embodiment, the present invention is implemented as a method for calibrating the drivers of an integrated circuit. The method includes configuring a first impedance for a driver of an output of the integrated circuit (e.g., a pull up circuit or a pull down circuit) according to a first configuration code and measuring a first voltage at the output pad which corresponds to the first configuration code. The method further includes configuring a second impedance for a driver of an output of the integrated circuit according to a second configuration code and measuring a second voltage at the output pad which corresponds to the second configuration code. A determination of which of the first voltage or the second voltage is nearest or equal to a predetermined voltage value and a determination of which of the first code or the second code corresponds to the first voltage or the second voltage nearest or equal to the predetermined voltage are made. Based on the code determined, the drivers of the integrated circuit is configured (e.g., a fuse blown) according to the first code or the second code corresponding to the voltage nearest or equal to the predetermined voltage. A fuse may be coupled to a pull up circuit or a pull down circuit. The method may be operable during circuit testing using ATE equipment and processes and may be effective at compensating for process variations of the circuit.

In another embodiment, the present invention is implemented as a system for calibrating a driver of an integrated circuit. The system includes an interface for coupling an integrated circuit to be calibrated and an impedance configuration module operable to issue a first code and a second code to the integrated circuit wherein the first code and the second code are associated with a first impedance value associated with drivers and a second impedance value of an output of the integrated circuit. The system further includes a voltage measurer for measuring a first voltage and a second voltage at output pads of the integrated circuit. The first and second voltage may correspond to the first and second code. Based on the first and second voltage, a code determiner determines whether the first code or the second code results in a voltage closer or equal to a predetermined voltage (e.g., a voltage when the impedance of a test circuit and the output circuit match). Based on the determined code, an integrated circuit configuration module configures (e.g., blows a fuse) the drivers of the integrated circuit according to the first code or the second code. The system may be implemented during circuit testing using ATE equipment and processes.

In this manner, embodiments of the present invention implement a mechanism to calibrate the drivers of an integrated circuit to compensate for process variations using the output pins or balls used for normal operations of the integrated circuit. Thus, extra dedicated pins or balls and additional circuitry are not required for calibration purposes. Embodiments further reduce power used for calibrating an integrated circuit by calibrating a portion of the integrated circuit during testing of the integrated circuit.

In another embodiment, the present invention is implemented in conjunction with a programmable system on a chip (SoC). The SoC includes an output to which a pull up circuit and a pull down circuit are coupled. The pull up circuit and the pull down circuit are each further coupled to an impedance configuration circuit operable to configure an impedance of the pull up circuit and the pull down circuit based on an impedance value obtained in accordance with the above disclosed method. The SoC further includes a fuse operable to fix the impedance configuration of the pull up circuit and a fuse operable to fix the impedance configuration of the pull down circuit. The impedance configuration circuit may be operable to configure the impedances of all pull up and pull down resistors or all drivers of the SoC to compensate for process variations. The SoC may additionally include an on chip voltage and/or temperature sensor (e.g., an on-chip resistor) coupled to an on chip calibration circuit to provide further real time calibration for temperature and/or voltage variations.

BRIEF DESCRIPTION OF THE DRAWINGS

The present invention is illustrated by way of example, and not by way of limitation, in the figures of the accompanying drawings and in which like reference numerals refer to similar elements.

DETAILED DESCRIPTION OF THE INVENTION

Figure 1:
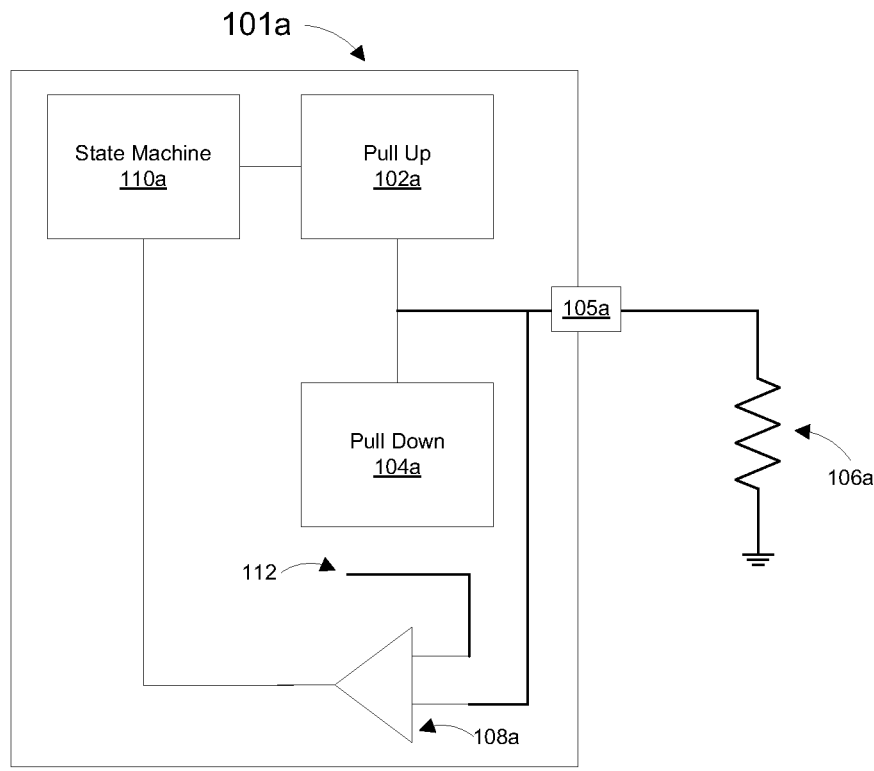
FIG. 1 shows a conventional integrated circuit calibration system for output drivers.
Figure 1:
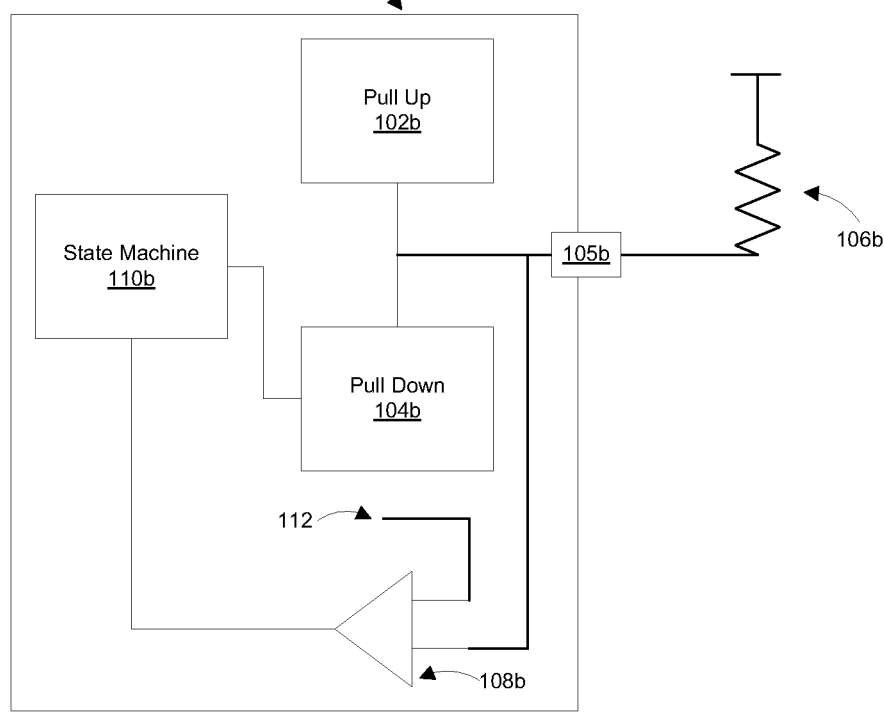

Reference will now be made in detail to the preferred embodiments of the present invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of embodiments of the present invention, numerous specific details are set forth in order to provide a thorough understanding of the present invention. However, it will be recognized by one of ordinary skill in the art that the present invention may be practiced without these specific details. In other instances, well-known methods, procedures, components, and circuits have not been described in detail as not to unnecessarily obscure aspects of the embodiments of the present invention.

Notation and Nomenclature:

Some portions of the detailed descriptions, which follow, are presented in terms of procedures, steps, logic blocks, processing, and other symbolic representations of operations on data bits within a computer memory. These descriptions and representations are the means used by those skilled in the data processing arts to most effectively convey the substance of their work to others skilled in the art. A procedure, computer executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "processing" or "accessing" or "executing" or "storing" or "rendering" or the like, refer to the action and processes of an integrated circuit (e.g., system on a chip 200 of FIG. 2), or similar electronic computing device, that manipulates and transforms data represented as physical (electronic) quantities within the computer system's registers and memories into other data similarly represented as physical quantities within the computer system memories or registers or other such information storage, transmission or display devices.

Figure 2:
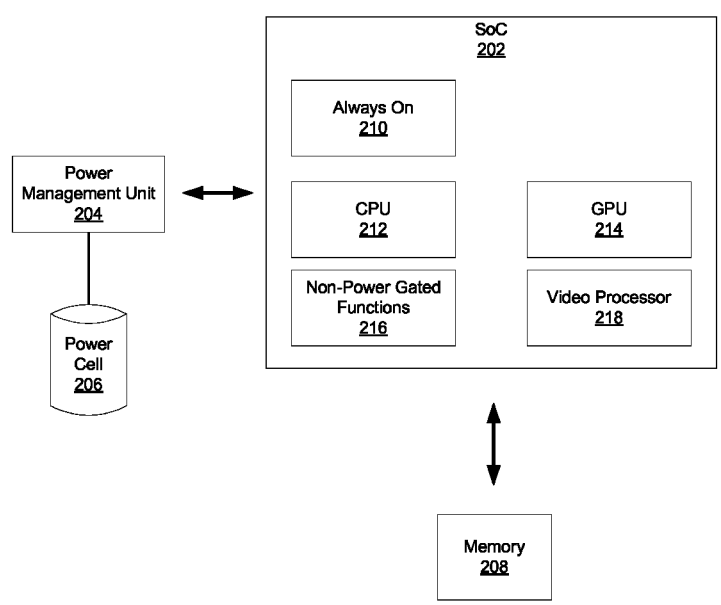
FIG. 2 shows an exemplary integrated circuit architecture in accordance with one embodiment of the present invention.

System Architecture:

Although embodiments of the present invention may be applied to any integrated circuit, FIG. 2 shows an exemplary integrated circuit architecture in accordance with one embodiment of the present invention. Integrated circuit architecture 200 includes system on a chip (SoC) 202, external power management unit (PMU) 204, power cell 206, and memory 208. SoC 202 includes always on module 210, central processor unit (CPU) 212, graphics processing unit (GPU) 214, non-power gated functions 216, and video processor 218. It is appreciated that always on module 210 and non-power gated functions 216 are optional.

Integrated circuit architecture 200 depicts the components of a basic system in accordance with embodiments of the present invention providing the execution platform for certain hardware-based and software-based functionality. Video processor 218 performs a variety of video related functions including, but not limited to, encoding, decoding, and reencoding of video. Non-power gated functions 216 may be put into a sleep state but also remain powered while other portions of SoC 202 are put into a sleep state. Non-power gated functions 216 can provide functionality to facilitate real time responsiveness of a device.

The CPU 212 can access memory 208 via a bridge component/memory controller (not shown) or can be directly coupled to the memory 208 via a memory controller (not shown) internal to the CPU 212. Memory 208 facilitates storage of component (e.g., context information), application, and operating system information for SoC 202. For example, memory 208 may be used to store context information and other information when portions of SoC 202 enter low power or sleep states.

Power cell 206 provides power to integrated circuit architecture 200. Power cell 206 may be a variety of power sources including, but not limited to, batteries, electrical sockets, and the like.

PMU 204 provides and regulates power to SoC 202. In one embodiment, PMU 204 provides power to SoC 202 via voltage rails (not shown) coupled to select group of components. For example, PMU 204 may provide power to always on module 210 via an always on voltage rail and provide power to the rest of SoC 202 via a main voltage rail.

In one embodiment, always on module 210 is a power partition which remains powered while other portions of SoC 202 are put into a sleep state. Always on module 210 may thus facilitate portions of SoC 202 (e.g., CPU 212, GPU 214, video processor 218, and non-powered gated functions 216) entering and leaving sleep states. Always on module 210 may include resources (e.g., registers and the like) for storing information to facilitate portions of SoC 202 going into a sleep state.

Integrated circuit architecture 200 can be implemented as, for example, a portable device or hand held device including, but not limited to, cellular telephone, personal digital assistant (PDA), smartphone, audio player (e.g., MP3 player), video player, and the like. In such an embodiment, components can be included that add peripheral buses, specialized audio/video components, I/O devices, and the like. These I/O devices may have driver circuits. Embodiments of the present invention, as discussed more fully herein are pertinent to these driver circuits.

In this fashion, embodiments of the present invention use regular output cells for calibration and do not require extra on chip circuitry to perform driver calibration. In one embodiment, a portion of the driver calibration may be part of the testing process after a chip is manufactured. Embodiments of the present invention may also provide dynamic compensation to changes in temperature and voltage (e.g., via a polysilicon resistor).

Figure 3:
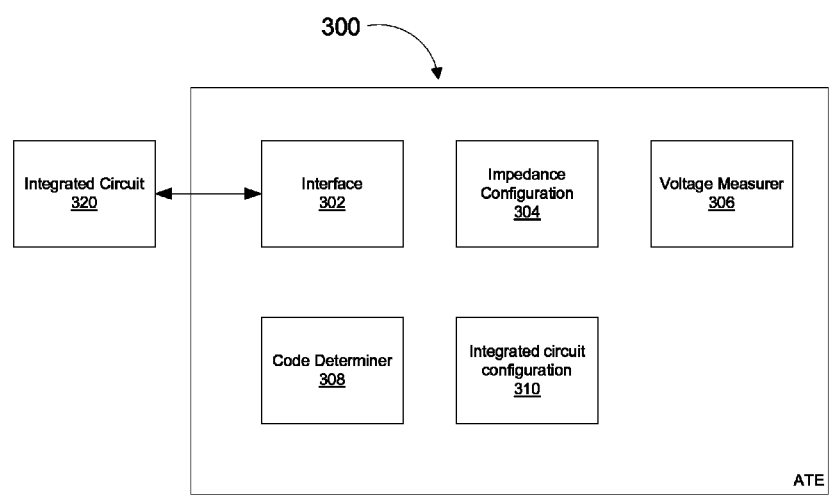
FIG. 3 shows a block diagram of an exemplary system for calibrating an integrated circuit in accordance with one embodiment of the present invention.

FIG. 3 illustrates example components used by various embodiments of the present invention. Although specific components are disclosed in system 300, it should be appreciated that such components are examples. That is, embodiments of the present invention are well suited to having various other components or variations of the components recited in system 300. It is appreciated that the components in system 300 may operate with other components than those presented, and that not all of the components of system 300 may be required to achieve the goals of system 300.

FIG. 3 shows a block diagram of an exemplary system for calibrating an integrated circuit in accordance with one embodiment of the present invention. System 300 includes interface 302, impedance configuration module 304, voltage measurer 306, code determiner 308, and integrated circuit configuration module 310. System 300 may be part of a semiconductor test equipment (e.g., automatic test equipment (ATE)) used as is well known during and/or after manufacturing of an integrated circuit.

Interface 302 facilitates coupling system 300 to an integrated circuit to be calibrated. The integrated circuit 320 may include one or more pull up circuits and one or more pull down circuits in various driver cells in the I/O functionality of the integrated circuit. The integrated circuit 320 may further include a fuse or other non-volatile storage coupled to the one or more pull up circuits and a fuse or other non-volatile storage coupled to the one or more pull down circuits. Interface 302 may facilitate calibration via the coupling of outputs of an integrated circuit 320 to system 300. In one embodiment, at least one output of the integrated circuit is a general purpose input output (GPIO). It is appreciated that the pull up and pull down resistors are configurable by application of a code thereto.

Impedance configuration module 304 is operable to issue a first code and a second code to the integrated circuit 320. The first and second codes may be associated with a first impedance value and a second impedance value of a driver of an output of the integrated circuit. In one embodiment, the first and second impedance codes are issued to a first and a second pull up circuits or a first and second pull down circuits of drivers of the integrated circuit. In another embodiment, the first impedance may be part of a first set of codes and the second impedance code may be part of a second set of impedance codes issued to the pull up or a pull down circuit of the drivers of the integrated circuit. It is appreciated that the first and second impedance codes may be issued during the calibration of pull up circuits or pull down circuits.

Voltage measurer 306 measures a first voltage and a second voltage at the respective output pads of the drivers of the integrated circuit. The first voltage may correspond to the first code or impedance value and the second voltage may correspond to the second code or impedance value. The respective outputs may be taken at a ball or pin of an integrated circuit package.

Code determiner 308 is operable to determine whether a first voltage corresponding to the first code or a second voltage corresponding to the second code is closer to a predetermined voltage. The predetermined voltage is typically established to read half of the supply voltage to the drivers so that the impedance of the driver matches the impedance of the transmission line. It is appreciated that matching impedance prevents or reduces signal reflection and maximizes the energy transmitted. Based on this voltage determination, code determiner 308 may determine a code corresponding to an impedance which matches a predetermined impedance value which is the desired value (e.g., match of impedance of an integrated circuit output with the impedance of a test circuit). In one embodiment, the first and second codes may be part of a plurality of codes which are respectively issued to each of a plurality of drivers (e.g., pull up circuits or pull down circuits) of the integrated circuit. For example, if an integrated circuit has 32 outputs with each output driver coupled to a pull up circuit and a pull down circuit, a different code (e.g., 5 bit code) may be issued to each pull up circuit and code determiner 308 will determine which code results in the voltage nearest or equal to the desired voltage as all driver output voltages are measured. In another embodiment, M outputs may be compared over N iterations to find the best code. The process may be repeated for the pull down circuits of the integrated circuit by issuing a different code to each pull down circuit and based on the voltages measured by voltage measurer 306, code determiner 308 can determine the code which results in the desired voltage (e.g., based on an impedance match) and therefore corresponds to the appropriate impedance calibration of the drivers of the integrated circuit.

Integrated circuit configuration module 310 is operable to configure the integrated circuit according to the code that yielded the best voltage match across the drivers. In one embodiment, integrated circuit configuration module 310 may configure the integrated circuit by configuring a fuse (e.g., by blowing the fuse) or other non-volatile storage device within the integrated circuit. The fuse may be associated with a plurality of pull up circuits within the integrated circuit or associated with a plurality of pull down circuits within the integrated circuit to set, across all drivers, the appropriate impedance, this effectively calibrates the drivers for process variations associated therewith.

Code determiner 308 may further determine an acceptable code via interpolation. The impedance code may determined by interpolation to find an appropriate code between two codes. For example, if 32 codes were issued to a plurality of pull up circuits of an integrated circuit and N codes result in a voltage equally close but not equal to the desired voltage, code determiner 308 may use interpolation to determine a code that is closest to the mid point of the N matching codes resulting the voltage closest to the desired voltage.

Figure 4:
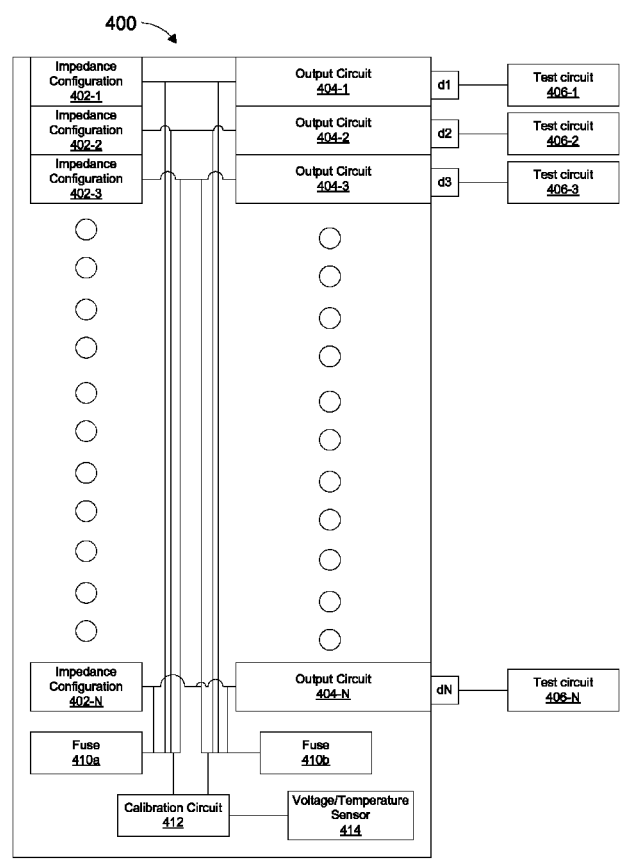
FIG. 4 shows an exemplary block diagram of an integrated circuit with output drivers coupled to a tester in accordance with one embodiment of the present invention.

FIG. 4 shows an exemplary block diagram of a programmable system on a chip (SoC) 400 coupled to a tester in accordance with one embodiment of the present invention. System 400 includes output pads or pins d1-dN, impedance configuration circuits 402-1-402-N, output driver circuits 404-1-404-N, test circuits 406-1-406-N, fuses 410a-410b, calibration circuit 412, and voltage/temperature sensor 414. Fuses 410a and 410b may be coupled to output driver circuits 404-1-404-N. It is appreciated that fuses 410a and 410b may be coupled to separate or different portions of output driver circuits 404-1-404-N (e.g., fuse 410a may be coupled to a pull up circuit of each output driver circuits 404-1-404-N and fuse 410b may be coupled to a pull down circuit of each output driver circuit 404-1-404-N). SoC 400 may be calibrated by a testing system (e.g., system 300).

Impedance configuration circuits 402-1-402-N receive codes (e.g., issued by impedance configuration module 304) which are used to calibrate the output impedance of each of output driver circuits 404-1-404-N. In one embodiment, impedance configuration circuits 402-1-402-N receive impedance codes from automatic test equipment. Each impedance configuration circuit 402-1-402-N may be used to vary the impedance of output driver circuits 404-1-404-N over N settings which may be based on the number of possible impedance codes (e.g., the number of bits in each code). More specifically, impedance configuration circuits 402-1-402-N may configure the impedance of a pull up circuit or a pull down circuit within output driver circuits 404-1-404-N.

Test circuits 406-1-406-N then measure the voltage at outputs d1-dN. Test circuits 406-1-406-N may have an impedance of a desired value that is to be configured on output circuits 404-1-404-N. Test circuits 406-1-406-N may also determine the difference between the voltage at outputs d1-dN and a desired voltage which corresponds to the desired impedance.

For example, where N is 32 and 32 different codes are available (e.g., a code is 5 bits), the codes may be issued in sequence from 1 to 32 to each respective impedance configuration circuit 402-1-402-32 which in turn varies the impedance of each output circuits 404-1-404-32. Test circuits 406-1-406-32 may then measure the voltages at outputs d1-d32 and a determination may be made of which voltage at outputs d1-dN is closest to the desired or predetermined voltage typically half the drive supply voltage. The code used by one of impedance configuration circuits 402 that corresponds to the output with the closest voltage to the desired voltage is determined. Then fuses 410a or 410b of the integrated circuit may be configured (e.g., blown) to hold or fix the value corresponding the determined code. Thus, fuses 410a and 410b may fix the impedance of the output circuits 404-1-404-N. In the way all drivers 404-1 to 404-N are calibrated for the optimum output impedance.

In another embodiment, where the number of codes is larger than the number of outputs, the codes may be applied to the outputs in one or more sets to facilitate testing all the codes in as few passes as possible. For example, where N is 16 and each code is 5 bits (e.g., 32 possible codes), codes 1-16 may be applied to the outputs circuits 404-1-404-16 and then codes 17-32 may be applied to output circuits 404-1-404-16. The corresponding voltages of the first set (1-16) may be recorded and then the voltages of the second set (17-32) may be recorded. Both sets may then be compared to the predetermined voltage and the code corresponding to a voltage closest to the predetermined voltage may be used to configure output circuits 404-1-404-16.

In one exemplary embodiment, where the number of codes is less than the number of outputs, the codes may be applied to a portion of the outputs to facilitate testing of the pull up circuits and the pull down circuits in parallel. For example, where there are 32 codes (e.g., 5 bit codes) and there are 64 outputs, each of the 32 different codes may be used configure the pull up circuits on outputs 1-32 and each of the 32 different codes may be used to configure the pull down circuits on outputs 33-64. Thus, the appropriate codes for the pull up and pull down circuits may be determined in parallel.

It is appreciated that the N codes could be applied to output circuit 404-1 and the voltage measured at d1 N times and the corresponding voltage measured and recorded for each code. The code resulting in the desired voltage may then be determined based on the measured voltages. It is further appreciated that testing a plurality of codes in parallel can result in substantial time savings over testing a single code on a single output at a time. By calibrating the output drivers in the above fashion, embodiments of the present invention compensate the output drivers for process variations.

The SoC 400 may further include on-chip voltage/temperature sensor 414 to facilitate additional voltage and/or temperature compensations. Voltage/temperature sensor 414 may be coupled to calibration circuit 412 which is coupled to each of output circuits 404-1-404-N. In one embodiment, voltage/temperature sensor 414 may be a polysilicon resistor which facilitates tracking of voltage and temperature variations during operation of the SoC. It is appreciated that the on-chip polysilicon resistor does not utilize a pin or ball of an the SoC and requires less power than an off-chip resistor.

Calibration circuit 412 receives voltage and/or temperature information from voltage/temperature sensor 414 and uses the voltage and/or temperature information to issue an offset code to the code fixed by fuses 410a and 410b to further calibrate output circuits 404-1-404-N during operation. Thus, SoC 400 may be calibrated for changes in process, voltage, and temperature during operation.

Figure 5:
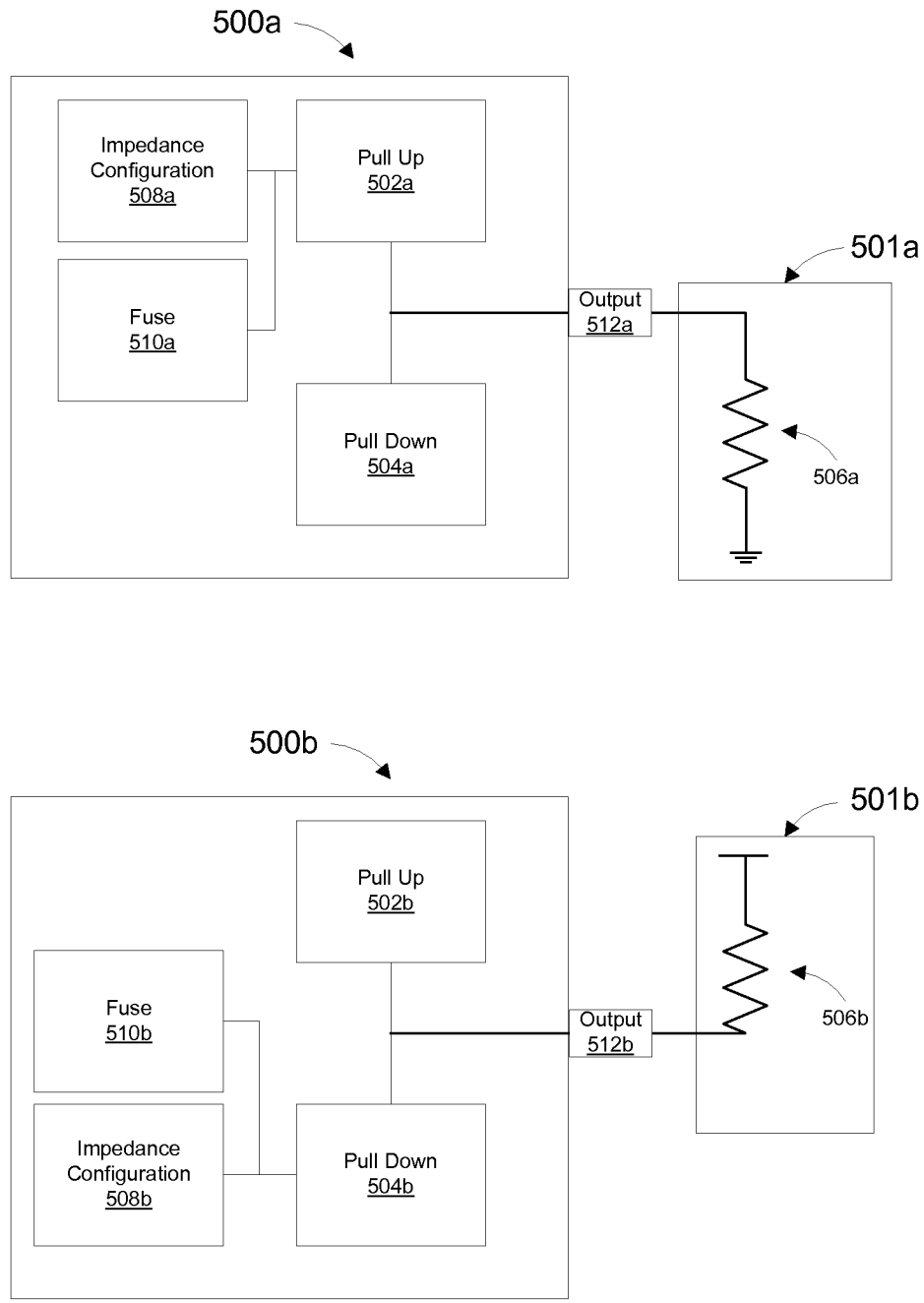
FIG. 5 shows exemplary driver circuits of the system on a chip coupled to the tester in accordance with one embodiment of the present invention.

FIG. 5 shows exemplary driver circuits of an exemplary integrated circuit device coupled to a tester in accordance with one embodiment of the present invention. Circuits 500a and 500b may be portions of an output circuit (e.g., output circuits 404-1-404-N) in a SoC (e.g., SoC 400). Circuits 500a and 500b may configure pull up circuit 502a and pull down circuit 502b via a multiplexer which also can receive input from the rest of the integrated circuit (e.g., SoC 400).

Circuit 500a includes configurable pull up circuit 502a, configurable pull down circuit 504a, impedance configuration circuit 508a, fuse 510a, and output 512a. Circuit 500a shows an exemplary circuit configuration for calibrating the impedance of pull up circuit 502a. Circuit 500a may be coupled via output 512a to testing circuit 501a (e.g., testing circuits 406-1-406-N). Testing circuit 501a may include pull down resistor 506a and measure the voltage at output 512a.

Circuit 500b includes configurable pull up circuit 502b, configurable pull down circuit 504b, impedance configuration circuit 508b, fuse 510b, and output 512b. Circuit 500b shows an exemplary circuit configuration for calibrating the impedance of pull down circuit 502b. Circuit 500b may be coupled via output 512b to testing circuit 501b (e.g., testing circuits 406-1-406-N). Testing circuit 501b may include pull down resistor 506b and measure the voltage at output 512b.

During calibration of an integrated circuit (e.g., SoC 400) codes may be applied to the pull up circuits and then the pull down circuits (via impedance configuration circuits 508a and 508b). Each different code may be applied to one or more pull up circuit 502a, the voltage measured, and the impedance code which results in the impedance of pull up circuit 502a being near or the same as the impedance of pull down resistor 506a is determined for fixing the impedance of one or more pull up circuit 504a. Fuse 510a may be configured (e.g., blown) to fix the impedance of pull down circuit 504b.

For example, where pull up circuit 502a pulls up to VDDIO when the impedance of pull up circuit 502a and the impedance of pull down resistor 506a are near or equal, test circuit 501a may measure the voltage at output 512a to be at or near VDDIO/2. It is appreciated that VDDIO/2 may be the predetermined or desired voltage described herein. The code corresponding to the measured voltage being near to VDDIO/2 may then be used to configure circuit 500a.

Similarly, the impedance of pull down circuit 504b may be configured based on testing of various impedance codes using the ATE system. Output 512b may couple circuit 500b to pull up resistor 506b. Each different code may be applied (e.g., via impedance configuration circuit 508b) to one or more pull down circuits 502b, the voltage is measured, and the impedance code which results in the impedance of pull down circuit 502a being near or the same as the impedance of pull up resistor 506b may be determined for fixing the impedance of one or more pull down circuit 504b. Fuse 510b may be configured (e.g., blown) to fix the impedance of pull down circuit 504b.

Figure 6:
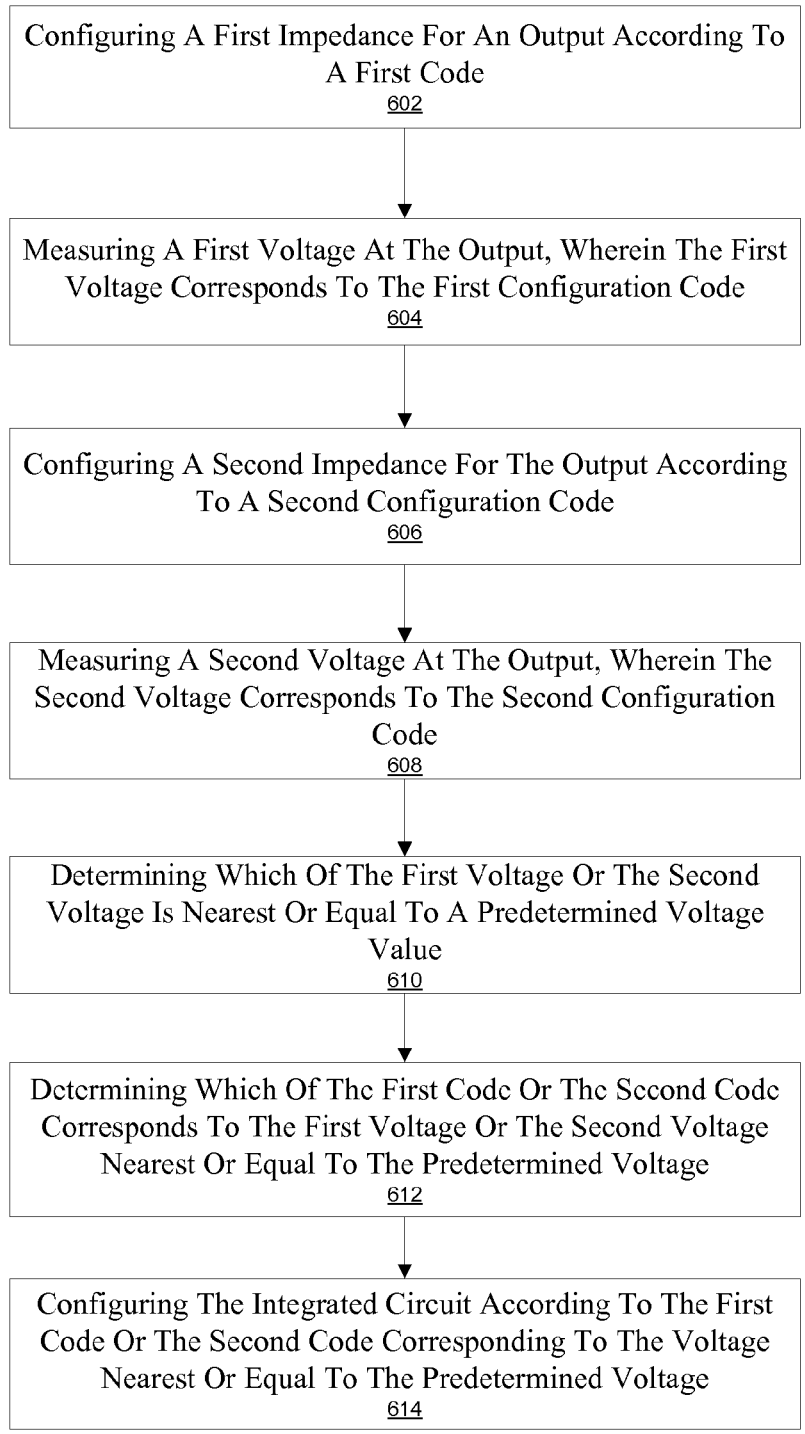
FIG. 6 shows a flowchart of a computer controlled process for calibrating an integrated circuit in accordance with one embodiment of the present invention.

With reference to FIG. 6, flowchart 600 illustrates example functions used by various embodiments of the present invention for calibrating an integrated circuit. Flowchart 600 includes processes that, in various embodiments, are carried out during the manufacture of an integrated circuit and the individual steps may be computer controlled. Although specific function blocks ("blocks") are disclosed in flowchart 600, such steps are examples. That is, embodiments are well suited to performing various other blocks or variations of the blocks recited in flowchart 600. It is appreciated that the blocks in flowchart 600 may be performed in an order different than presented, and that not all of the blocks in flowchart 600 may be performed.

FIG. 6 shows a flowchart 600 of a process for calibrating an integrated circuit in accordance with one embodiment of the present invention. The blocks of flowchart may be carried out by a piece of testing equipment (e.g., system 300 or automatic test equipment) in the process of configuring an integrated circuit (e.g., SoC 400).

At block 602, a first impedance for an output of the integrated circuit is configured according to a first configuration code. In one embodiment, the output is a general purpose input/output (GPIO). As described herein, the impedance for the output may be configured via pull up circuit or via a pull down circuit.

At block 604, a first voltage at the output pin is measured corresponding to the driver with the first code. The first voltage may correspond to the first configuration code. As described herein, the measuring of the first voltage may be performed by an integrated circuit tester.

At block 606, a second impedance for the second output pin of the integrated circuit is configured according to a second configuration code. As described herein, the impedance for the output may be configured via pull up circuit or via a pull down circuit.

At block 608, a second voltage is measured at the second output. The second voltage may correspond to the second configuration code. As described herein, the measuring of the first voltage and the second voltage may be performed by an integrated circuit tester. These steps may be performed across each output pin to be calibrated.

At block 610, the first voltage or the second voltage which is nearest or equal to a predetermined voltage value is determined. As described here, the predetermined voltage may be a voltage (e.g., VDDIO/2) corresponding to a match of impedance between a tester circuit (e.g., test circuit 406-1) and an output circuit (e.g., output circuit 404-1, pull up circuit 502a, or pull down circuit 504b).

At block 612, the first code or the second code which corresponds to the first voltage or the second voltage nearest or equal to the predetermined voltage is determined. In one embodiment, the first code is part of a first set of codes and the second code is part of a second set of codes. For example, the first code could be part of a set of codes tested using a first set of output configurations (e.g., 1-16) and the second code could be part of a second set of codes tested using a second set of output configurations (e.g., 17-32).

At block 614, all the output drivers of the integrated circuit are configured according to the first code or the second code corresponding to the voltage nearest or equal to the predetermined voltage. As described here, the integrated circuit may be configured according to the first code or second code by blowing a fuse coupled to the output of the integrated circuit. The fuse blown may be associated with a pull up circuit or a pull down circuit of the integrated circuit.

The foregoing descriptions of specific embodiments of the present invention have been presented for purposes of illustration and description. They are not intended to be exhaustive or to limit the invention to the precise forms disclosed, and many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A method for calibrating an integrated circuit, comprising:
configuring a first impedance for a first output driver of said integrated circuit according to a first configuration code;
measuring a first voltage at the output of said first output driver, wherein said first voltage corresponds to said first configuration code;

configuring a second impedance for a second output driver of said integrated circuit according to a second configuration code;

measuring a second voltage at the output of said second output driver, wherein said second voltage corresponds to said second configuration code;

comparing said output of said first output driver and said output of said second output driver to a predetermined voltage value;

determining which of said first voltage and said second voltage is nearest to said predetermined voltage value; and configuring said integrated circuit according to a code of said first and second codes that corresponds to said voltage nearest to said predetermined voltage.

2. The method as described in claim 1 wherein said measuring of said first voltage and said second voltage is performed by an integrated circuit tester coupled to said integrated circuit.

3. The method as described in claim 1 wherein said configuring comprises blowing a fuse disposed with said integrated circuit that controls said first and second impedance.

4. The method as described in claim 3 wherein said fuse is coupled to a pull up circuit.

5. The method as described in claim 3 wherein said fuse is coupled to a pull down circuit.

6. The method as described in claim 1 wherein said configuring said first and second impedance for said first and second output is via pull up circuits.

7. The method as described in claim 1 wherein said configuring said first and second impedance for said first and second output is via pull down circuits.

8. The method as described in claim 1 wherein said first and second output is a general purpose input/output (GPIO).

9. The method as described in claim 1 wherein said first code is part of a first set of codes and said second code is part of a second set of codes.

10. The method as described in claim 1 wherein said first output driver is coupled to a first output pin of said integrated circuit and said second output driver is coupled to a second output pin of said integrated circuit.

11. The method as described in claim 1 further comprising:
generating an offset code based on voltage and temperature variations corresponding to said integrated circuit.

12. The method as described in claim 11 wherein said configuring said integrated circuit comprises configuring said integrated circuit according to a code of said first and second codes that corresponds to said voltage nearest to said predetermined voltage, and offset by said offset code.

13. The method as described in claim 11 wherein said voltage and temperature variations are tracked in a voltage and temperature sensor.

14. The method as described in claim 13 wherein said voltage and/or temperature sensor comprises a polysilicon resistor.

15. A system for calibrating an integrated circuit comprising:
an interface for coupling an integrated circuit to be calibrated;
an impedance configuration module operable to issue a first code and a second code to a first driver and a second driver, respectively, of said integrated circuit wherein said first code and said second code are associated with a first impedance value and a second impedance value of said first and second drivers of said integrated circuit;
a voltage measurer for measuring a first voltage and a second voltage at outputs of said first and second drivers of said integrated circuit;
a temperature sensor for tracking temperature variations of said integrated circuit;
a code determiner operable to compare said first voltage and said second voltage to a predetermined value and to determine which voltage of said first voltage corresponding to said first code and said second voltage corresponding to said second code is closer to said predetermined voltage, and to generate signal based on said temperature variations; and
an integrated circuit configuration module operable to configure said first and second drivers of said integrated circuit according to said first code or said second code based on whether said first voltage or said second voltage is closest to said predetermined voltage, and offset by said signal.

16. The system of claim 15 wherein said code determiner determines a third code via interpolation.

17. The system of claim 15 wherein said first driver of said integrated circuit comprises a pull up circuit and wherein said impedance configuration module issues said first code to said pull up circuit.

18. The system of claim 17 wherein said integrated circuit configuration module is operable to configure said integrated circuit by blowing a fuse coupled to said pull up circuit.

19. The system of claim 15 wherein said first driver of said integrated circuit comprises a pull down circuit and wherein said impedance configuration module is operable to issue said first code to said pull down circuit.

20. The system of claim 19 wherein said integrated circuit configuration module is operable to configure said integrated circuit by blowing a fuse coupled to said pull down circuit.

21. The system of claim 15 wherein at least one output of said integrated circuit is a general purpose input output (GPIO).

22. A programmable system on a chip (SoC) comprising:
a plurality of outputs;
a plurality of drivers respectively coupled to said plurality of outputs, each driver comprising:
a pull up circuit coupled to a respective output;
a pull down circuit coupled to said respective output;
a plurality of impedance configuration circuits, wherein each of said plurality of impedance configuration circuits is coupled to a respective driver of said plurality of drivers and wherein each of said impedance configuration circuits is operable to configure a different impedance of each respective pull up circuit and each respective pull down circuit of said respective driver of said plurality of drivers;
a first fuse operable to fix the impedance configuration of each pull up circuit based on a calibration result performed on said SoC during testing;
a second fuse operable to fix the impedance configuration of each pull down circuit based on said calibration result;
a voltage and/or temperature sensor operable to track voltage and temperature variations of the SoC, and
a calibration circuit operable to calibrate the plurality of drivers based on said tracked voltage and temperature variations and a predetermined voltage, wherein said calibration circuit is operable to calibrate said plurality of drivers based on a comparison of said tracked voltage and said predetermined voltage.

23. The SoC as described in claim 22 further comprising a Graphical Processing Unit (GPU).

24. The SoC as described in claim 22 further comprising a video processor.

25. The SoC as described in claim 22 wherein said voltage and/or temperature sensor comprises a polysilicon resistor which facilitates said tracking of voltage and temperature variations during operation of the SoC.

26. The SoC as described in claim 25 wherein said polysilicon resistor does not utilize a pin or ball of the SoC.

* * * * *